United States Patent
Yanagisawa et al.

(10) Patent No.: US 11,504,669 B2
(45) Date of Patent: Nov. 22, 2022

(54) METHOD FOR EXHAUST GAS ABATEMENT UNDER REDUCED PRESSURE AND APPARATUS THEREFOR

(71) Applicant: Kanken Techno Co., Ltd., Nagaokakyo (JP)

(72) Inventors: Michihiko Yanagisawa, Nagaokakyo (JP); Tsutomu Tsukada, Nagaokakyo (JP); Hiroshi Imamura, Nagaokakyo (JP)

(73) Assignee: KANKEN TECHNO CO., LTD., Kyoto (JP)

( * ) Notice: Subject to any disclaimer, the term of this patent is extended or adjusted under 35 U.S.C. 154(b) by 587 days.

(21) Appl. No.: 16/603,413

(22) PCT Filed: Apr. 20, 2018

(86) PCT No.: PCT/JP2018/016293
§ 371 (c)(1),
(2) Date: Oct. 7, 2019

(87) PCT Pub. No.: WO2018/221067
PCT Pub. Date: Dec. 6, 2018

(65) Prior Publication Data
US 2020/0038805 A1    Feb. 6, 2020

(30) Foreign Application Priority Data
May 29, 2017 (JP) .............. JP2017-105712

(51) Int. Cl.
*B01D 53/46* (2006.01)
*B01D 53/74* (2006.01)
(Continued)

(52) U.S. Cl.
CPC ............ *B01D 53/46* (2013.01); *B01D 53/74* (2013.01); *B01D 2257/40* (2013.01);
(Continued)

(58) Field of Classification Search
CPC .......... F04B 37/14; F04B 37/18; F04B 15/04; F04B 41/06; F04D 17/168; H05H 1/32;
(Continued)

(56) References Cited

U.S. PATENT DOCUMENTS 10,617,997 B1 *   4/2020   Maeda ................ C23C 16/4405

FOREIGN PATENT DOCUMENTS

| JP | H07-024081 A | 1/1995 |
| JP | 2000317265 A | 11/2000 |

(Continued)

OTHER PUBLICATIONS

International Search Report dated Jun. 12, 2018 for Application No. PCT/JP2018/016293 and English translation.
Office Action dated Jan. 17, 2019 for corresponding Taiwanese Application No. 107115204 (Taiwanese only).
Office Action dated May 29, 2019 for corresponding Taiwanese Application No. 107115204 (Taiwanese only).
(Continued)

*Primary Examiner* — Timothy C Vanoy
(74) *Attorney, Agent, or Firm* — Lucas & Mercanti, LLP

(57) ABSTRACT

The present invention provides an energy-efficient method and apparatus that can achieve exhaust gas abatement with a minimum use of diluent nitrogen gas. More specifically, the present invention is directed to a method and apparatus for exhaust gas abatement under reduced pressure, in which an exhaust gas supplied from an exhaust gas source via a vacuum pump is decomposed by heat of a high-temperature plasma under a reduced pressure.

4 Claims, 2 Drawing Sheets

(51) Int. Cl.
    *F04B 15/04*    (2006.01)
    *F04D 17/16*    (2006.01)

(52) U.S. Cl.
    CPC ............... *B01D 2258/0216* (2013.01); *B01D 2259/818* (2013.01); *F04B 15/04* (2013.01); *F04D 17/168* (2013.01)

(58) Field of Classification Search
    CPC .............. H05H 1/30; B01D 2258/0216; B01D 2259/818; B01D 53/46; B01D 53/32; B01D 2257/40; B01D 53/74; B01D 2257/553; B01D 53/64; B01D 2257/60; H01L 21/31; B01J 19/088; B01J 2219/0093; B01J 2219/0805; B01J 2219/0898
    See application file for complete search history.

(56) References Cited

FOREIGN PATENT DOCUMENTS

| | | | | |
|---|---|---|---|---|
| JP | 2007-522935 A | 8/2007 | | |
| JP | 2008-506851 A | 3/2008 | | |
| JP | 4796733 B2 | 10/2011 | | |
| KR | 2001 0 011 881 | * | 2/2001 | ............ B01J 19/126 |
| TW | I361102 B | 4/2012 | | |
| WO | 2005/079958 A1 | 9/2005 | | |
| WO | 2006/008521 A1 | 1/2006 | | |
| WO | WO 2010 027 184 A2 | * | 3/2010 | ............ B01D 53/323 |
| WO | WO 2018 216 446 A1 | * | 11/2018 | ............. B01D 53/32 |

OTHER PUBLICATIONS

JPO, Office Action for the related Japanese Patent Application No. 2019-522023, dated Jan. 28, 2020, with English translation.

\* cited by examiner

METHOD FOR EXHAUST GAS ABATEMENT UNDER REDUCED PRESSURE AND APPARATUS THEREFOR

CROSS REFERENCE TO RELATED APPLICATION

This Application is a 371 of PCT/JP2018/016293 filed on Apr. 20, 2018 which in turn, claimed the priority of Japanese Patent Application No. 2017-105712 filed on May 29, 2017, both applications are incorporated herein by reference.

TECHNICAL FIELD

The present invention relates to an exhaust gas abatement method and apparatus suitable for treatment of harmful exhaust gases such as combustible gases, toxic gases, and greenhouse gases emitted in the manufacturing processes mainly in the electronics industry.

BACKGROUND ART

In the electronics industry for manufacturing semiconductors, liquid crystals, etc., various CVD processes are used for producing various films such as silicon nitride films, silicon oxide films, silicon oxynitride films, TEOS oxide films, high dielectric constant films, low dielectric constant films, and metal films.

Among these, for example, silicon-based thin films are formed by a CVD method mainly using an explosive and toxic silane-based gas. In this CVD method, after being used in a CVD process, the used process gas as an exhaust gas containing the above-mentioned silane-based gas is rendered harmless in an abatement apparatus as described in Patent Literature 1 below. It is conventional practice to dilute the silane-based gas in the exhaust gas with a large amount of diluent nitrogen gas introduced upstream of the abatement apparatus so as to reduce the concentration of the silane-based gas to a level lower than the lower explosive limit.

Here, in a typical CVD process for forming silicon oxynitride films, $SiH_4/NH_3/N_2O=1$ slm/10 slm/10 slm (slm: standard liter per minute, i.e., a unit of flow rate of a gas at 0° C. and 1 atm expressed in terms of liters per minute) is used. Since the explosion range of $SiH_4$ is 1.3% to 100%, the gas mixture emitted in this CVD process must be diluted with about 76 parts of diluent nitrogen gas immediately after the emission. After the dilution, a conventional pyrolysis (thermal decomposition) apparatus, for example, a combustion type pyrolysis apparatus or an atmospheric plasma type pyrolysis apparatus disclosed in Patent Literature 1 below (Japanese Patent No. 4796733) can be used to perform abatement treatment safely and reliably.

CITATION LIST

Patent Literature

[PTL 1] Japanese Patent No. 4796733

SUMMARY OF INVENTION

Technical Problem

However, the above-described conventional technique has a problem.

Specifically, the energy required for heating the exhaust gas mixture containing a silane-based gas and nitrogen gas used to dilute the silane-based gas as described above to the decomposition temperature is about 76 times the energy required for heating only the exhaust gas containing the undiluted silane-based gas. This means that in the conventional abatement process that requires dilution with nitrogen gas, not only the exhaust gas but also the nitrogen gas that is not directly involved in the abatement of the exhaust gas must be heated and thus the energy efficiency decreases, resulting in an increase in the cost of electricity, fuels, etc., in addition to an increase in the cost of nitrogen gas used in large amounts.

In particular, a conventional atmospheric plasma type pyrolysis apparatus, in which plasma is generated at atmospheric pressure, has the disadvantage of requiring very high voltage, which may cause various accidents such as fires. The conventional apparatus has another disadvantage of much energy loss because a considerable amount of heat is dissipated from the wall of the exhaust gas treatment chamber. The conventional apparatus has still another disadvantage of requiring frequent maintenance because the flow rate of the gas is low and the growth of particles is accelerated in the exhaust gas treatment chamber.

It is therefore a primary object of the present invention to provide an energy-efficient and economically efficient method and apparatus that can achieve exhaust gas abatement with a minimum use of diluent nitrogen gas without sacrificing safety.

Solution to Problem

In order to achieve the above object, according to the present invention, exhaust gas abatement is performed under reduced pressure.

More specifically, a first aspect of the present invention is a method for exhaust gas abatement under reduced pressure, including decomposing an exhaust gas E supplied from an exhaust gas source 12 via a vacuum pump 14, by heat of a high-temperature plasma 22 under a reduced pressure.

The first aspect of the present invention has, for example, the following advantageous effects.

Since the exhaust gas E supplied from the exhaust gas source 12 via the vacuum pump 14 is decomposed by heat of a high-temperature plasma 22 under a reduced pressure, there is no need to use diluent nitrogen gas or the use of nitrogen gas can be reduced to a minimum.

Since there is no need to dilute with diluent nitrogen gas or the use of the nitrogen gas can be reduced to a minimum, almost all the heat of the high-temperature plasma 22 can be used directly for decomposition of the exhaust gas E. In addition, since a region located downstream of the outlet of the exhaust gas E source and including the abatement treatment unit is under reduced pressure, even if the exhaust gas E contains toxic substances to humans, there is no risk that the exhaust gas E leaks from the system before being heated and decomposed by the heat of the high-temperature plasma 22.

Furthermore, according to the present invention, since "the exhaust gas E is decomposed by the heat of the high-temperature plasma 22 under a reduced pressure", in other words, "the high-temperature plasma 22 used as the heat source of the pyrolysis (thermal decomposition) treatment is generated under a reduced pressure", the voltage required to generate the high-temperature plasma 22 is lower than that required at atmospheric pressure. As a result, it is possible to prevent accidental fires and achieve abatement of the exhaust gas E with lower power. It is also possible to reduce heat dissipation from the wall of the exhaust gas treatment chamber and thus improve energy efficiency. In addition, it is also possible to increase the flow rate of the gas to about 2 to 10 times that at atmospheric pressure and thus retard the deposition and growth of reaction product particles in the exhaust gas treatment chamber and extend the maintenance cycle.

Here, in the first aspect of the present invention, the reduced pressure is preferably in a range of 50 Torr or more and 400 Torr or less.

When the reduced pressure is lower than 50 Torr, an expensive and elaborate system is needed to achieve a high vacuum environment. In contrast, when the reduced pressure is higher than 400 Torr, which is not very different from the atmospheric pressure, the exhaust gas E must be diluted with a large amount of nitrogen gas.

A second aspect of the present invention is an apparatus for performing the method for exhaust gas abatement under reduced pressure described above. This apparatus 10 for exhaust gas abatement under reduced pressure is configured as follows, for example, as shown in FIG. 1 and FIG. 2.

Specifically, an apparatus 10 for exhaust gas abatement under reduced pressure according to the present invention includes: a reaction chamber 18 in which an exhaust gas E supplied from an exhaust gas source 12 via a vacuum pump 14 is decomposed by heat of a high-temperature plasma 22; a plasma generation unit 20 configured to eject the high-temperature plasma 22 into the reaction chamber 18; and a downstream vacuum pump 24 configured to reduce a pressure in a region located downstream of an outlet of the vacuum pump 14 and including the reaction chamber 18.

In the second aspect of the present invention, the plasma generation unit 20 preferably includes a plasma generation fluid supply unit 26 configured to supply at least one selected from the group consisting of nitrogen, oxygen, argon, helium, and water, as a fluid for high-temperature plasma generation.

When plasma is generated at atmospheric pressure, if not a single working gas but a mixture of gases including the working gas is used as a fluid for high-temperature plasma generation, a stable plasma cannot be generated. However, in the apparatus 10 for exhaust gas abatement under reduced pressure according to the present invention, since the high-temperature plasma 22 is generated under a reduced pressure, the resulting plasma is very stable. Therefore, not only the main working gas but also an optional secondary gas serving as a reaction accelerating gas can be used in combination as a fluid for high-temperature plasma generation. As a result, various types of high-temperature plasma 22 can be generated for different purposes.

In the second aspect of the present invention, the high-temperature plasma is generated in the plasma generation unit 20 preferably by using one of the following techniques: direct current arc discharge; inductive coupling; and capacitive coupling.

In this case, a conventional atmospheric plasma-type unit can be used directly as the plasma generation unit 20.

Advantageous Effects of the Invention

According to the present invention, it is possible to provide an energy-efficient and economically efficient method and apparatus that can achieve exhaust gas abatement with a minimum use of diluent nitrogen gas without sacrificing safety.

DESCRIPTION OF EMBODIMENTS

Hereinafter, an embodiment of the present invention will be described with reference to FIG. 1 and FIG. 2.

Figure 1:
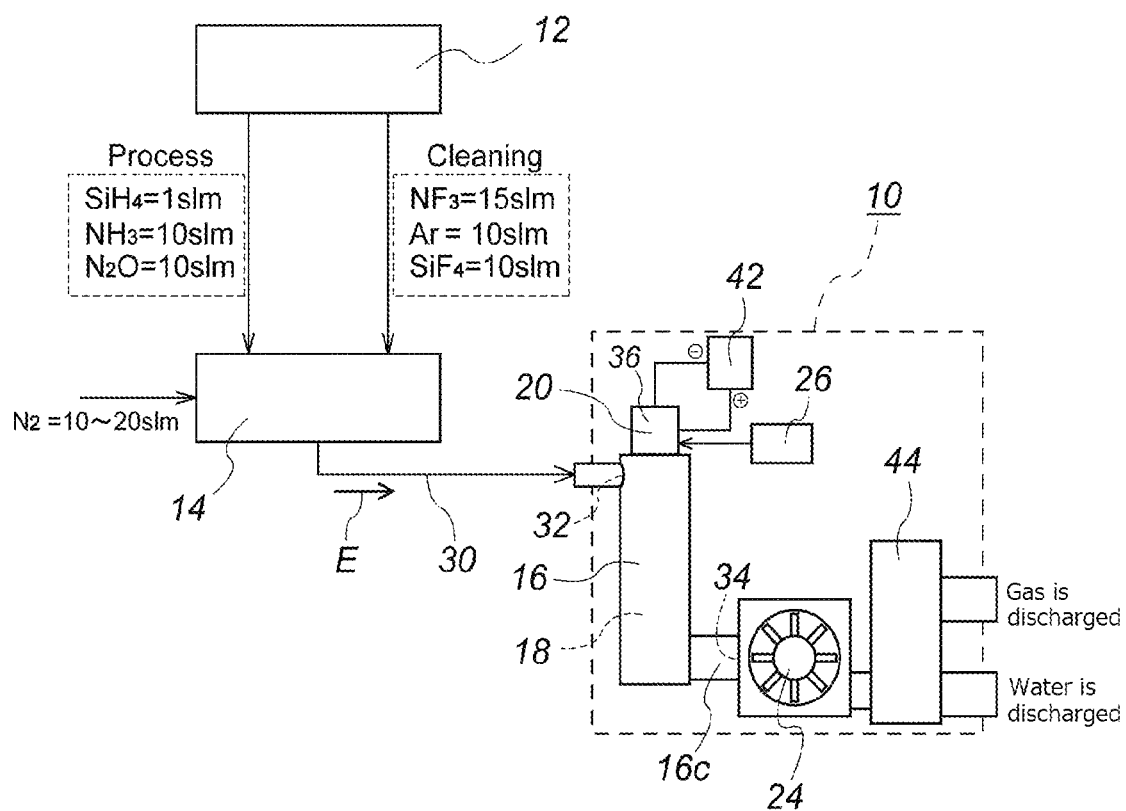
FIG. 1 is a diagram showing an overview of an apparatus for exhaust gas abatement under reduced pressure according to an embodiment of the present invention.

FIG. 1 is a diagram showing an overview of an apparatus 10 for exhaust gas abatement under reduced pressure according to an embodiment of the present invention. As shown in FIG. 1, the apparatus 10 for exhaust gas abatement under reduced pressure according to this embodiment is an apparatus for abatement of an exhaust gas E supplied from an exhaust gas source 12 such as a CVD apparatus via a vacuum pump 14, and mainly includes: a reaction tube 16 having a reaction chamber 18 and a plasma generation unit 20; and a downstream vacuum pump 24.

Here, the embodiment of FIG. 1 shows a silicon oxynitride film CVD apparatus as an example of the exhaust gas source 12. In a typical silicon oxynitride film CVD apparatus, $SiH_4/NH_3/N_2O=1$ slm/10 slm/10 slm is used as a process gas, and $NF_3/Ar=15$ slm/10 slm is used as a cleaning gas. It is presumed that $SiF_4$ as a product of the cleaning reaction is emitted at about 10 slm. A mixture of these spent gases is supplied as the exhaust gas E to the apparatus 10 for abatement under reduced pressure via the vacuum pump 14. It should be noted that in a semiconductor device manufacturing process such as a CVD process for forming silicon oxynitride films, a dry pump is mainly used as the vacuum pump 14. Therefore, $N_2$ (nitrogen gas) supplied to this vacuum pump 14 is purging $N_2$ supplied to seal the shaft of the vacuum pump 14.

Figure 2:
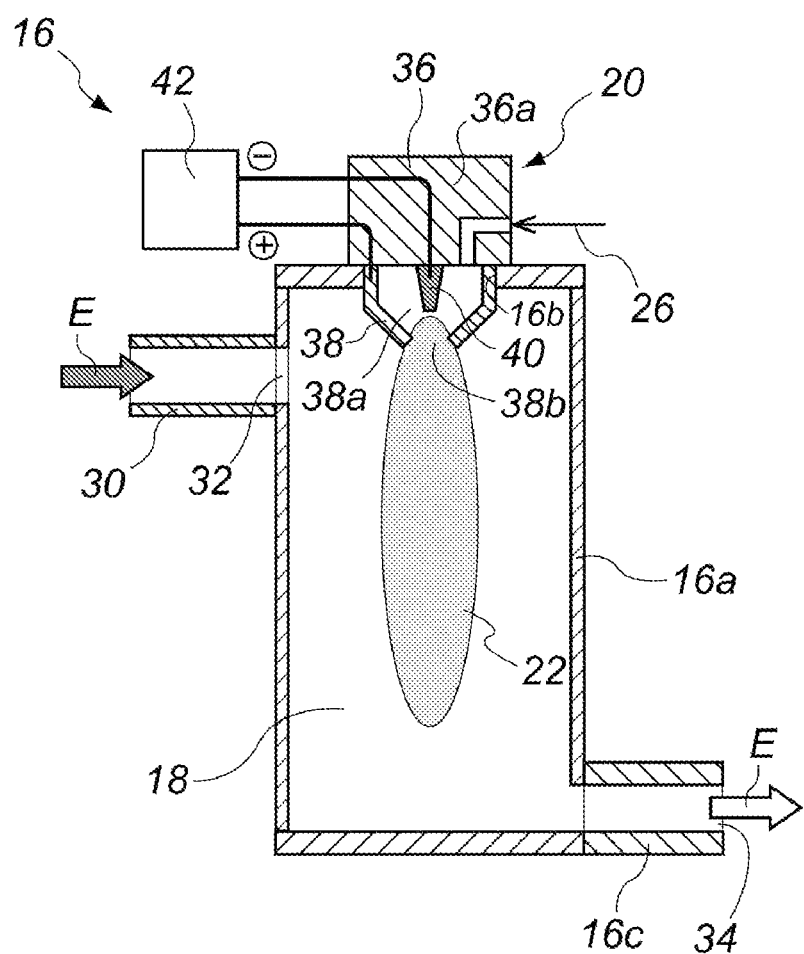
FIG. 2 is a partial cross-sectional front view showing an example of a reaction tube of the apparatus for exhaust gas abatement under reduced pressure according to the present invention.

The reaction tube 16 is formed of a corrosion-resistant metallic material such as Hastelloy (registered trademark), and has an approximately cylindrical casing 16a mounted upright with its axis vertical (see FIG. 2). The inner space of the casing 16a serves as a reaction chamber 18 for decomposing the exhaust gas E, and the upper end portion of the outer circumferential wall of the casing 16a is provided with an exhaust gas inlet 32 communicating with the outlet of the vacuum pump 14 through a pipe 30. On the other hand, the inlet end of a horizontally extending duct 16c is connected to the lower part of the casing 16a, and the outlet end of the duct 16c is provided with an exhaust gas outlet 34 connected directly to the inlet of a downstream vacuum pump 24.

An opening 16b is formed in the top portion of this casing 16a, and the plasma generation unit 20 is connected to the opening 16b (see FIG. 2).

The plasma generation unit 20 is configured to generate a high-temperature (or hot) plasma 22 in the form of a plasma arc or a plasma jet. In the present embodiment, the plasma generation unit 20 includes a plasma jet torch 36 for generating a high-temperature plasma by direct current (DC) arc discharge (see FIG. 2).

This plasma jet torch 36 has a torch body 36a made of a metal material such as brass. An anode 38 is connected continuously to one end (the lower end in FIG. 2) of the torch body 36a, and a rod-shaped cathode 40 is connected to be disposed in the anode 38.

The anode 38 is a tubular nozzle-type electrode made of a highly conductive, high melting point metal such as copper, copper alloy, nickel, or tungsten, and having a plasma generation chamber 38a formed in its cavity. An ejection port 38b for ejecting a jet of the high-temperature plasma 22 generated inside the plasma generation chamber 38a is formed in the central portion of the lower surface of the anode 38.

The cathode 40 is a rod-shaped electrode element made of thorium-doped or lanthanum-doped tungsten or the like and includes a tapered end portion having an outer diameter decreasing toward the tip and disposed in the plasma generation chamber 38a mentioned above.

In order to prevent electrical contact (i.e., short circuit) between the anode 38 and the anode 40 through the torch body 36a, an insulating material (not shown) such as a tetrafluoroethylene resin or a ceramic is disposed therebetween. Cooling water channels (not shown) are provided in the anode 38 and the cathode 40, respectively, to cool these components.

A power supply unit 42 is connected to the anode 38 and the cathode 40 of the plasma jet torch 36 configured as described above, so as to apply a predetermined discharge voltage and form an arc between the anode 38 and the cathode 40. As the power supply unit 42, a so-called switching-type DC power supply device is suitably used.

The plasma generation unit 20 configured as described above includes a plasma generation fluid supply unit 26.

The plasma generation fluid supply unit 26 is configured to supply at least one selected from the group consisting of nitrogen, oxygen, argon, helium, and water, as a fluid for high-temperature plasma generation, into the plasma generation chamber 38a of the anode 38, and includes a storage tank for storing these fluids and a piping system for communicating the storage tank and the plasma generation chamber 38a of the anode 38, although not shown in the figures. This piping system is provided with a flow controller such as a mass flow controller.

The downstream vacuum pump 24 is a pump for reducing the pressure in the region located downstream of the outlet of the vacuum pump 14 and including the reaction chamber 18 of the reaction tube 16 to a predetermined degree of vacuum and drawing the exhaust gas E that has undergone abatement treatment in the reaction chamber 18 to discharge it. In the present embodiment, a water-sealed pump is used as the downstream vacuum pump 24. Therefore, on the outlet side of the downstream vacuum pump 24, a separator 44 such as a gas-liquid separator coalescer is optionally provided to separate the treated exhaust gas E and the seal water in their mixture discharged from the downstream vacuum pump 24 (see FIG. 1).

Here, the reduced pressure created by the downstream vacuum pump 24 for the exhaust gas flow region located downstream of the outlet of the vacuum pump 14 and including the reaction chamber 18 is preferably in a range of 50 Torr or more and 400 Torr or less, and more preferably in a range of 100±40 Torr. When the reduced pressure is lower than 50 Torr, an expensive and elaborate system is needed to achieve a high vacuum environment. In contrast, when the reduced pressure is higher than 400 Torr, which is close to the atmospheric pressure, the exhaust gas E must be diluted with a large amount of nitrogen gas, which is comparable to the amount of nitrogen gas required to dilute the exhaust gas E under atmospheric pressure.

It is needless to say that the apparatus 10 for exhaust gas abatement under reduced pressure according to the present embodiment includes various types of detectors, controllers, and power supplies that are necessary to generate the high-temperature plasma 22 in the plasma generation unit 20 and to operate the downstream vacuum pump 24, and others, although not shown in the figures.

Next, a method for exhaust gas E abatement under reduced pressure using the apparatus 10 for exhaust gas abatement under reduced pressure configured as described above will be described.

The exhaust gas E discharged from the exhaust gas source 12 is delivered to the reaction tube 16 via the vacuum pump 14. When the downstream vacuum pump 24 is operated, the exhaust gas E is introduced into the reaction chamber 18 under a predetermined reduced pressure, where the exhaust gas E is decomposed by the heat of the high-temperature plasma 22 ejected from the plasma generation unit 20.

According to the method for exhaust gas abatement under reduced pressure of the present embodiment, the exhaust gas E is decomposed by the heat of the high-temperature plasma 22 under the reduced pressure, and therefore there is no need to use diluent nitrogen gas or the use of the nitrogen gas can be reduced to a minimum. Since there is no need to dilute with diluent nitrogen gas or the use of the nitrogen gas can be reduced to a minimum, almost all the heat of the high-temperature plasma 22 can be used directly for decomposition/reaction of the exhaust gas E. A combination of these two advantageous effects allow the exhaust gas E abatement apparatus to be configured very compactly.

In addition, since the region located downstream of the outlet of the exhaust gas source and including the abatement treatment unit is under the reduced pressure, even if the exhaust gas E contains toxic substances to humans, there is no risk that the exhaust gas E leaks from the system before being decomposed by the heat of the high-temperature plasma 22.

The following modifications may be made to the embodiment described above.

In the above embodiment, DC arc discharge is used as a technique for generating a high-temperature plasma in the plasma generation unit 20 connected to the reaction tube 16, but any other high-temperature plasma generation technique can be used as long as the plasma generation unit 20 can eject a plasma with a temperature high enough to thermally decomposing the exhaust gas E. For example, other techniques such as inductive coupling and capacitive coupling are suitably used to generate a high-temperature plasma.

In the above embodiment, a water-sealed pump is used as the downstream vacuum pump 24. However, a dry pump or the like may be used instead of this water-sealed pump, for example, when there is no need to wash decomposition products with water after the exhaust gas E abatement treatment.

In the above embodiment, the vacuum pump 14 and the exhaust gas inlet 32 of the reaction tube 16 are connected by the pipe 30. However, the outlet of the vacuum pump 14 and the exhaust gas inlet 32 may be connected directly to each other. Furthermore, in the above embodiment, the exhaust gas outlet 34 of the reaction tube 16 and the inlet of the downstream vacuum pump 24 are connected directly to each other. However, the exhaust gas outlet 34 of the reaction tube 16 and the downstream vacuum pump 24 may be connected by a pipe.

It will be understood that various modifications may be made to the above embodiment within the scope of knowledge of those skilled in the art.

REFERENCE SIGNS LIST

10: Apparatus for exhaust gas abatement under reduced pressure
12: Exhaust gas source
14: Vacuum pump
16: Reaction tube
18: Reaction chamber
20: Plasma generation unit
22: High-temperature plasma
24: Downstream vacuum pump
26: Plasma generation fluid supply unit
E: Exhaust gas

The invention claimed is:

1. A method for exhaust gas abatement under reduced pressure, comprising decomposing an exhaust gas supplied from an exhaust gas source via a vacuum pump, by heat of a high-temperature plasma under a reduced pressure, the high-temperature plasma being generated in an atmospheric plasma type plasma generation unit by using direct current arc discharge.

2. The method for exhaust gas abatement under reduced pressure according to claim 1, wherein the reduced pressure is in a range of 50 Torr or more and 400 Torr or less.

3. An apparatus for exhaust gas abatement under reduced pressure, comprising:
a reaction chamber in which an exhaust gas supplied from an exhaust gas source via a vacuum pump is decomposed by heat of a high-temperature plasma;
an atmospheric plasma type plasma generation unit configured to generate the high-temperature plasma by using direct current arc discharge and to eject the high-temperature plasma into the reaction chamber; and
a downstream vacuum pump configured to reduce a pressure in a region located downstream of an outlet of the vacuum pump and including the reaction chamber.

4. The apparatus for exhaust gas abatement under reduced pressure according to claim 3, wherein the plasma generation unit comprises a plasma generation fluid supply unit configured to supply at least one selected from the group consisting of nitrogen, oxygen, argon, helium, and water, as a fluid for high-temperature plasma generation.

* * * * *